US012593449B2

(12) United States Patent
Shin et al.

(10) Patent No.: US 12,593,449 B2
(45) Date of Patent: Mar. 31, 2026

(54) VERTICAL NONVOLATILE MEMORY DEVICE INCLUDING GATE ELECTRODES WITH METAL-DOPED GRAPHENE

(71) Applicant: Samsung Electronics Co., Ltd., Suwon-si (KR)

(72) Inventors: Keunwook Shin, Yongin-si (KR); Changhyun Kim, Seoul (KR); Sehun Park, Suwon-si (KR); Hyunwoo Kim, Seoul (KR); Kyung-Eun Byun, Seongnam-si (KR); Dongjin Yun, Pohang-si (KR); Changseok Lee, Gwacheon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 505 days.

(21) Appl. No.: 17/986,371

(22) Filed: Nov. 14, 2022

(65) Prior Publication Data

US 2023/0157022 A1 May 18, 2023

(30) Foreign Application Priority Data

Nov. 16, 2021 (KR) ........................ 10-2021-0158043

(51) Int. Cl.
*H10B 43/27* (2023.01)
*G06N 3/065* (2023.01)
(52) U.S. Cl.
CPC ............. *H10B 43/27* (2023.02); *G06N 3/065* (2023.01)

(58) Field of Classification Search
CPC . H01L 27/1027; H01L 27/1028; H10B 53/00; H10B 53/10; H10B 53/20;
(Continued)

(56) References Cited

U.S. PATENT DOCUMENTS 8,476,765 B2 7/2013 Zhang et al.
8,541,769 B2 9/2013 Chu et al.
(Continued)

FOREIGN PATENT DOCUMENTS

CN 111785829 A 10/2020
JP 2019/102567 A 6/2019
(Continued)

OTHER PUBLICATIONS

Extended European Search Report dated Apr. 17, 2023, issued in corresponding European Patent Application No. 22207552.5.
(Continued)

*Primary Examiner* — William B Partridge
*Assistant Examiner* — Gustavo G Ramallo
(74) *Attorney, Agent, or Firm* — HARNESS, DICKEY & PIERCE, P.L.C.

(57) ABSTRACT

A vertical nonvolatile memory device may include a channel layer extending in a first direction; a plurality of gate electrodes and a plurality of spacers each extending in a second direction crossing the first direction, the plurality of gate electrodes and the plurality of spacers being alternately arranged with each other in the first direction; and a gate insulating layer extending in the first direction between the channel layer and the plurality of gate electrodes. Each of the plurality of gate electrodes may include a metal-doped graphene.

22 Claims, 12 Drawing Sheets

(58) Field of Classification Search

CPC ........ H10B 53/30; H10B 53/40; H10B 53/50; H10B 41/00; H10B 41/10; H10B 41/20; H10B 41/23; H10B 41/27; H10B 41/30; H10B 41/35; H10B 41/40–44; H10B 41/46–50; H10B 41/60; H10B 41/70; H10B 43/00; H10B 43/10; H10B 43/20; H10B 43/23; H10B 43/27; H10B 43/30; H10B 43/35; H10B 43/40; H10B 43/50; H10B 51/00; H10B 51/10; H10B 51/20; H10B 51/30; H10B 51/40; H10B 51/50

See application file for complete search history.

(56) References Cited

U.S. PATENT DOCUMENTS

| | | | | |
|---|---|---|---|---|
| 9,482,960 | B2 | 11/2016 | Yakunin et al. | |
| 10,312,329 | B2 | 6/2019 | Zhou | |
| 2012/0080086 | A1* | 4/2012 | Yoon ..................... | H10F 71/138 |
| | | | | 977/734 |
| 2012/0273872 | A1* | 11/2012 | Lim ....................... | H10D 88/00 |
| | | | | 257/E27.06 |
| 2012/0281484 | A1 | 11/2012 | Cho et al. | |
| 2014/0084357 | A1* | 3/2014 | Choi ................. | H01L 21/28008 |
| | | | | 438/589 |
| 2016/0343891 | A1 | 11/2016 | Heo et al. | |
| 2017/0033120 | A1 | 2/2017 | Lee et al. | |
| 2017/0263940 | A1* | 9/2017 | Huang ................... | C23C 16/26 |
| 2018/0151590 | A1 | 5/2018 | Lee et al. | |
| 2018/0358470 | A1 | 12/2018 | Lee et al. | |
| 2019/0165120 | A1 | 5/2019 | Sato | |
| 2019/0348466 | A1 | 11/2019 | Pillarisetty et al. | |
| 2020/0035602 | A1 | 1/2020 | Nam et al. | |
| 2020/0091306 | A1* | 3/2020 | Heo ..................... | H10D 64/689 |
| 2020/0373512 | A1* | 11/2020 | Liang ................... | H10K 85/20 |
| 2021/0020835 | A1 | 1/2021 | Lee et al. | |
| 2021/0167021 | A1 | 6/2021 | Wu et al. | |
| 2023/0079680 | A1 | 3/2023 | Shin et al. | |

FOREIGN PATENT DOCUMENTS

| | | | | | |
|---|---|---|---|---|---|
| KR | 10-2012-0124697 | A | 11/2012 | | |
| KR | 1479217 | B1 | 1/2015 | | |
| KR | 10-1636196 | * | 7/2016 | ........ | H01L 27/11521 |
| KR | 101636196 | B1 | 7/2016 | | |
| KR | 2016/0135590 | A | 11/2016 | | |
| KR | 10-2017-0014966 | A | 2/2017 | | |
| KR | 2018/0135316 | A | 12/2018 | | |
| KR | 2019/0045636 | A | 5/2019 | | |
| KR | 102062717 | B1 | 1/2020 | | |

OTHER PUBLICATIONS

Chaves, A., Azadani, J.G., Alsalman, H. et al. Bandgap engineering of two-dimensional semiconductor materials. npj 2D Mater Appl 4, 29 (2020). https://doi.org/10.1038/s41699-020-00162-4.

Korean Office Action dated Apr. 18, 2025 for corresponding Korean Patent Application No. 10-2021-0158043 and its English-language translation.

* cited by examiner

VERTICAL NONVOLATILE MEMORY DEVICE INCLUDING GATE ELECTRODES WITH METAL-DOPED GRAPHENE

CROSS-REFERENCE TO RELATED APPLICATION

This application is based on and claims priority under 35 U.S.C. § 119 to Korean Patent Application No. 10-2021-0158043, filed on Nov. 16, 2021, in the Korean Intellectual Property Office, the disclosure of which is incorporated by reference herein in its entirety.

BACKGROUND

1. Field

The disclosure relates to a vertical nonvolatile memory device including memory cell strings.

2. Description of the Related Art

A nonvolatile memory device may be a semiconductor memory device and may include a plurality of memory cells that retain data even when power is blocked and use the stored data again when power is supplied. As an example of use of the nonvolatile memory device, the nonvolatile memory device may be used in a cellular phone, a digital camera, a portable digital assistant (PDA), a mobile computer device, a stationary computer device, and other devices.

Recently, research into using a three-dimensional (or a vertical) NAND (or VNAND) structure in a chip for forming a next-generation neuromorphic computing platform or a neural network has been conducted. In particular, technology for obtaining high density and low power consumption and capable of allowing random access to a memory cell may be required.

SUMMARY

Provided is a vertical nonvolatile memory device in which a thickness of one memory cell is reduced to reduce a total thickness of a memory cell string and to increase the number of stacked memory cells.

Additional aspects will be set forth in part in the description which follows and, in part, will be apparent from the description, or may be learned by practice of the presented embodiments of the disclosure.

According to an embodiment, a nonvolatile memory device may include a channel layer extending in a first direction; a plurality of gate electrodes and a plurality of spacers each extending in a second direction crossing the first direction, the plurality of gate electrodes and the plurality of spacers being alternately arranged with each other in the first direction; and a gate insulating layer extending in the first direction between the channel layer and the plurality of gate electrodes. Each of the plurality of gate electrodes may include a metal-doped graphene.

In some embodiments, the metal-doped graphene may include a metal particle and the metal particle may include at least one of Ru, Al, Ti, Pt, Ta, Rh, Ir, and Co.

In some embodiments, a ratio of the metal particle to carbon in the metal-doped graphene may be about 1 atomic percent (at) % to about 50 at %.

In some embodiments, a ratio of carbon having an $sp^2$ bonding structure to total carbon in the metal-doped graphene may be about 50% to about 99%.

In some embodiments, the metal-doped graphene may include intrinsic graphene or nanocrystalline graphene.

In some embodiments, the nanocrystalline graphene may include crystals having a size of about 0.5 nm to about 500 nm.

In some embodiments, a work function of the metal-doped graphene may be greater than about 4.7 eV.

In some embodiments, the work function of the metal-doped graphene may be greater than about 4.9 eV.

In some embodiments, a thickness of each of the plurality of gate electrodes may be in a range of about 0.3 nm to about 15 nm.

In some embodiments, the gate insulating layer may include a diffusion barrier layer between the channel layer and the plurality of gate electrodes; a charge blocking layer between the channel layer and the diffusion barrier layer; a charge trap layer between the channel layer and the charge blocking layer; and a tunneling dielectric layer between the channel layer and the charge trap layer.

In some embodiments, the diffusion barrier layer, the charge blocking layer, the charge trap layer, and the tunneling dielectric layer may extend on a surface of the channel layer in the first direction.

In some embodiments, the charge blocking layer, the charge trap layer, and the tunneling dielectric layer may extend on a surface of the channel layer in the first direction. The diffusion barrier layer may include a first portion extending on the surface of the channel layer in the first direction. The diffusion barrier layer may include a second portion extending in the second direction and the second portion may cover an upper surface and a lower surface of each of the plurality of gate electrodes.

In some embodiments, the diffusion barrier layer, the charge blocking layer, the charge trap layer, and the tunneling dielectric layer each may include a first portion extending on a surface of the channel layer in the first direction and a second portion extending in the second direction to cover an upper surface and a lower surface of each of the plurality of gate electrodes.

In some embodiments, a side surface of each of the plurality of spacers may directly contact the surface of the channel layer.

In some embodiments, the diffusion barrier layer and the charge blocking layer may be integrated into a single layer including hexagonal boron nitride (h-BN).

In an embodiment, a neuromorphic apparatus may include a processing circuit and a memory system. The memory system may include the nonvolatile memory device according to the embodiment and a memory controller. The memory controller may be configured to perform a control operation on the nonvolatile memory device.

According to an embodiment, a nonvolatile memory device may include a channel layer extending in a first direction; a plurality of gate electrodes and a plurality of spacers each extending in a second direction crossing the first direction, the plurality of gate electrodes and the plurality of spacers being alternately arranged with each other in the first direction; and a gate insulating layer extending in the first direction between the channel layer and the plurality of gate electrodes. The gate insulating layer may include a hexagonal boron nitride (h-BN) layer between the channel layer and the plurality of gate electrodes; a charge trap layer between the channel layer and the h-BN layer; and a tunneling dielectric layer between the channel layer and the charge trap layer.

In some embodiments, each of the plurality of gate electrodes may include a metal-doped graphene.

In some embodiments, the metal-doped graphene may include a metal particle, and the metal particle may include at least one of Ru, Al, Ti, Pt, Ta, Rh, Ir, and Co.

In some embodiments, a ratio of the metal particle to carbon in the metal-doped graphene may be about 1 atomic percent (at) % to about 50 at %.

In some embodiments, a ratio of carbon having an $sp^2$ bonding structure to total carbon in the metal-doped graphene may be about 50% to about 99%.

In some embodiments, the metal-doped graphene may include nanocrystalline graphene.

In some embodiments, the nanocrystalline graphene may include crystals having a size of about 0.5 nm to about 150 nm.

In some embodiments, a work function of the metal-doped graphene may be greater than about 4.7 eV.

In some embodiments, the work function of the metal-doped graphene may be greater than about 4.9 eV.

In some embodiments, a thickness of each of the plurality of gate electrodes may be in a range of about 0.3 nm to about 15 nm.

In some embodiments, the h-BN layer, the charge trap layer, and the tunneling dielectric layer may extend in the first direction along a surface of the channel layer.

In some embodiments, the charge trap layer and the tunneling dielectric layer may extend on a surface of the channel layer in the first direction, and the h-BN layer may include a portion extending on the surface of the channel layer in the first direction and a portion extending in the second direction to cover an upper surface and a lower surface of each of the plurality of gate electrodes.

In some embodiments, the h-BN layer, the charge trap layer, and the tunneling dielectric layer each may include a portion extending on a surface of the channel layer in the first direction and a portion extending in the second direction to cover an upper surface and a lower surface of each of the plurality of gate electrodes.

In some embodiments, a side surface of each of the plurality of spacers may directly contacts a surface of the channel layer.

In an embodiment, a neuromorphic apparatus may include a processing circuit and a memory system. The memory system may include the nonvolatile memory device according to the embodiment and a memory controller. The memory controller may be configured to perform a control operation on the nonvolatile memory device.

According to an embodiment, a nonvolatile memory device may include a channel layer extending in a first direction; a plurality of gate electrodes each extending in a second direction crossing the first direction, the plurality of gate electrodes spaced apart from each other in the first direction along a sidewall of the channel layer; and a gate insulating layer between the channel layer and the plurality of gate electrodes. Each of the plurality of gate electrodes may include a metal-doped graphene.

In some embodiments, the gate insulating layer may include a charge trap layer spaced apart from the channel layer and the plurality of gate electrodes.

In some embodiments, the gate insulating layer may include a tunneling dielectric layer between the channel layer and the charge trap layer.

In some embodiments, the gate insulating layer may include a hexagonal boron nitride (h-BN) layer between the charge trap layer and the plurality of gate electrodes.

In some embodiments, the gate insulating layer may include a diffusion barrier layer between the charge trap layer and the plurality of gate electrodes, and the gate insulating layer may include a charge blocking layer between the charge trap layer and the diffusion barrier layer.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
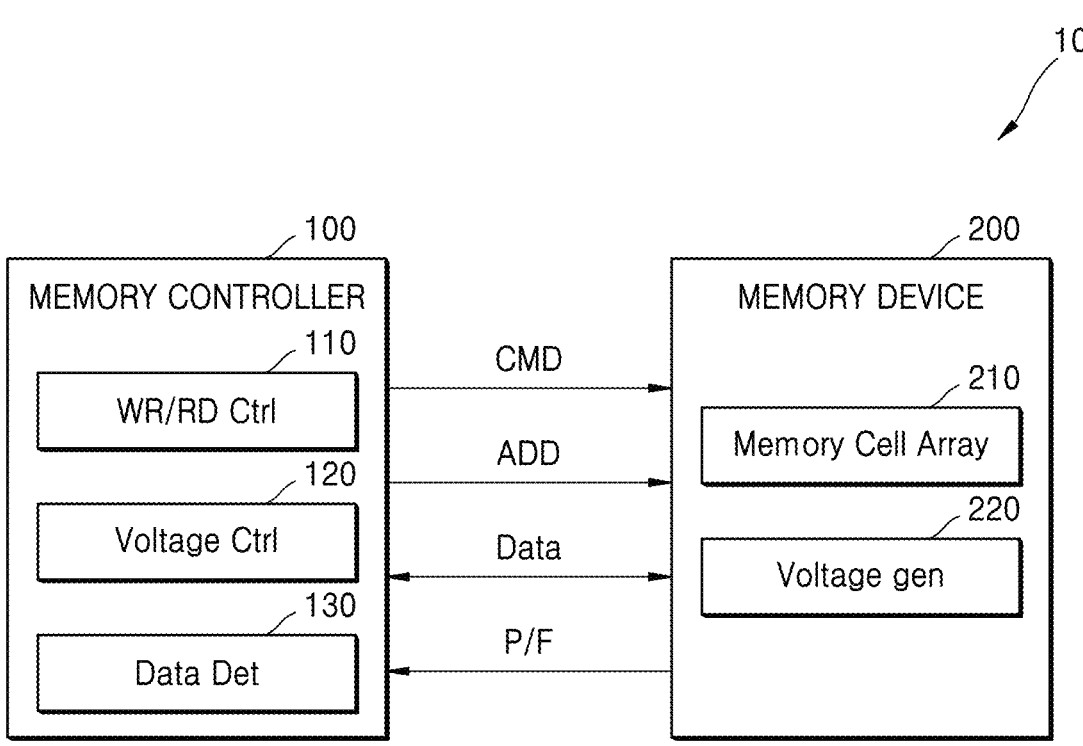
FIG. 1 is a block diagram of a memory system according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein.

Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list. For example, "at least one of A, B, and C," and similar language (e.g., "at least one selected from the group consisting of A, B, and C") may be construed as A only, B only, C only, or any combination of two or more of A, B, and C, such as, for instance, ABC, AB, BC, and AC.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Hereinafter, a vertical nonvolatile memory device including a memory cell string will be described in detail with reference to the accompanying drawings. In the drawings, the same reference numerals denote the same elements and sizes of elements may be exaggerated for clarity and convenience of explanation. Also, the embodiments described hereinafter are only examples, and various modifications may be made based on the embodiments.

Hereinafter, it will be understood that when an element is referred to as being "on" or "above" another element, the element can be directly over or under the other element and directly on the left or on the right of the other element, or intervening elements may also be present therebetween. As used herein, the singular terms "a" and "an" are intended to include the plural forms as well, unless the context clearly indicates otherwise. It will be further understood that when a part "includes" or "comprises" an element, unless otherwise defined, the part may further include other elements, not excluding the other elements.

The term "the" and other equivalent determiners may correspond to a singular referent or a plural referent. Operations included in a method may be performed in an appropriate order, unless the operations included in the method are described to be performed in an apparent order, or unless the operations included in the method are described to be performed otherwise.

Also, the terms such as " . . . unit," "module," or the like used in the specification indicate a unit, which processes at least one function or motion, and the unit may be implemented by hardware or software, or by a combination of hardware and software.

Furthermore, the connecting lines, or connectors shown in the various figures presented are intended to represent example functional relationships and/or physical or logical couplings between the various elements. It should be noted that many alternative or additional functional relationships, physical connections or logical connections may be present in a practical device.

The use of all examples and example terms are merely for describing the disclosure in detail and the disclosure is not limited to the examples and the example terms, unless they are not defined in the scope of the claims.

FIG. 1 is a block diagram of a memory system 10 according to an embodiment. Referring to FIG. 1, the memory system 10 according to an embodiment may include a memory controller 100 and a memory device 200. The memory controller 100 may perform a control operation on the memory device 200. For example, the memory controller 100 may provide an address ADD and a command CMD to the memory device 200 to perform a program (or write) operation, a read operation, and an erase operation on the memory device 200. Also, data for the program operation and read data may be transmitted and received between the memory controller 100 and the memory device 200. The memory device 200 may provide a pass/fail signal according to a read result of the read data to the memory controller 100, and the memory controller 100 may control a writing/reading operation of a memory cell array 210 based on the pass/fail signal.

The memory device 200 may include the memory cell array 210 and a voltage generator 220. The memory cell array 210 may include a plurality of memory cells arranged in regions where a plurality of word lines intersect with a plurality of bit lines. The memory cell array 210 may include nonvolatile memory cells storing data in a nonvolatile manner and include flash memory cells, as the nonvolatile memory cells, such as a NAND flash memory cell array or a NOR flash memory cell array. Hereinafter, embodiments of the disclosure will be described in detail on the assumption that the memory cell array 210 includes a flash memory cell array, and thus, the memory device 200 is a nonvolatile memory device.

The memory controller 100 may include a write/read controller 110, a voltage controller 120, and a data determiner 130.

The write/read controller 110 may generate an address ADD and a command CMD for performing programming/reading and erasing operations on the memory cell array 210. Also, the voltage controller 120 may generate a voltage control signal for controlling at least one voltage level used in the memory device 200. For example, the voltage controller 120 may generate a voltage control signal for controlling a voltage level of a word line for reading data from the memory cell array 210 or programming data on the memory cell array 210.

The data determiner 130 may determine the data read from the memory device 200. For example, in order to determine the data read from the memory cells, the data determiner 130 may determine the number of on cells and/or off cells from among the memory cells. As an example of an operation, when program operations are performed on the plurality of memory cells, a state of the data of the memory cells may be determined by using a desired and/or alternatively predetermined read voltage, in order to determine whether or not the program operations are normally completed on all of the cells.

As described above, the memory cell array 210 may include nonvolatile memory cells. For example, the memory cell array 210 may include flash memory cells. Also, the flash memory cells may be realized in various forms. For example, the memory cell array 210 may include three-dimensional (or vertical) NAND (or VNAND) memory cells.

Figure 2:
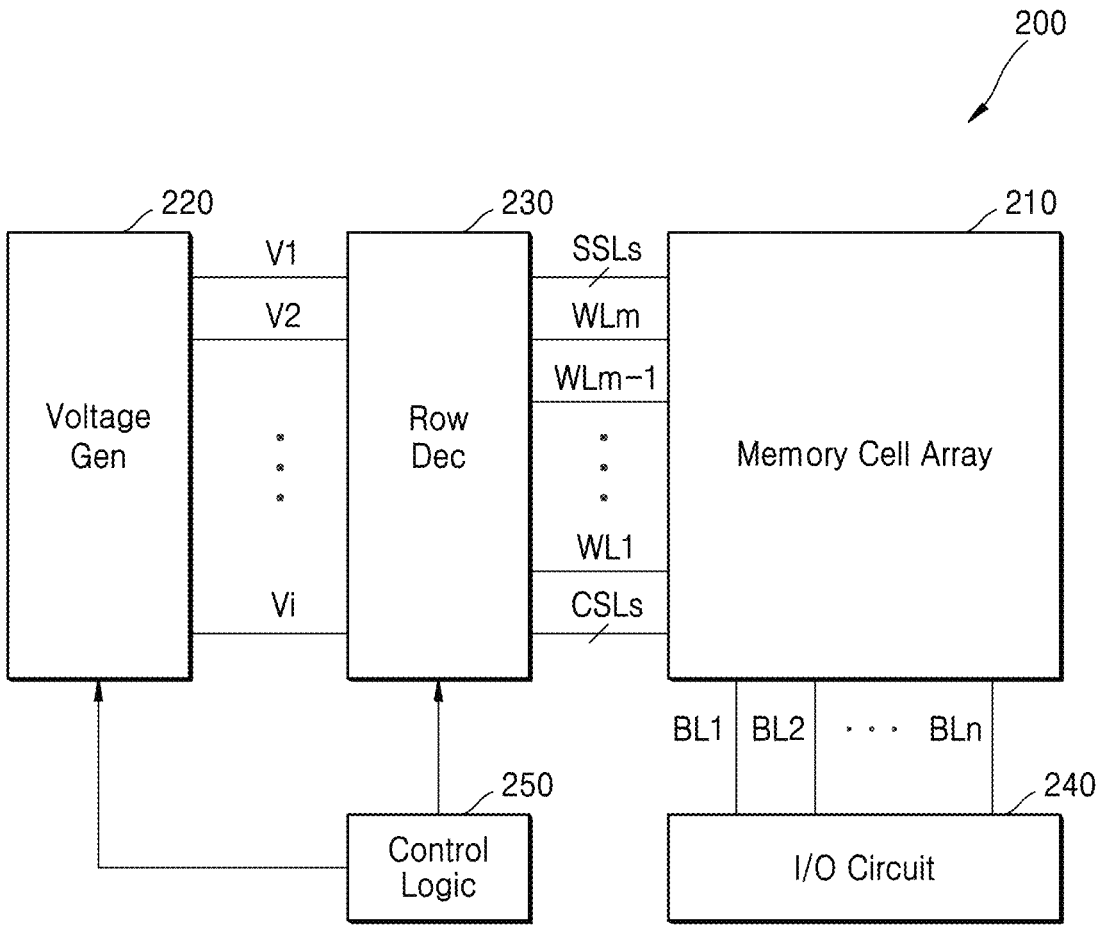
FIG. 2 is a block diagram of a memory device illustrated in FIG. 1, according to an embodiment.

FIG. 2 is a block diagram of the memory device 200 illustrated in FIG. 1, according to an embodiment. Referring to FIG. 2, the memory device 200 may further include a row decoder 230, an input and output circuit 240, and a control logic 250.

The memory cell array 210 may be connected to one or more string selection lines SSLs, a plurality of word lines WL1 through WLm, one or more common source line CSLs, and a plurality of bit lines BL1 through BLn. The voltage generator 220 may generate one or more word line voltages V1 through Vi, and the word line voltages V1 through Vi may be provided to the row decoder 230. Signals for programming/reading/erasing operations may be applied to the memory cell array 210 through the bit lines BL1 through BLn.

Also, data to be programmed may be provided to the memory cell array 210 through the input and output circuit 240, and read data may be provided to the outside (for example, a memory controller) through the input and output circuit 240. The control logic 250 may provide various control signals related to memory operations to the row decoder 230 and the voltage generator 220.

According to a decoding operation of the row decoder 230, the word line voltages V1 through Vi may be provided to various lines SSLs, WL1 through WLm, and CSLs. For example, the word line voltages V1 through Vi may include a string selection voltage, a word line voltage, and a ground selection voltage. The string selection voltage may be provided to one or more string selection lines SSLs, the word line voltage may be provided to one or more word lines WL1 through WLm, and the ground selection voltage may be provided to one or more common source lines CSLs.

Figure 3:
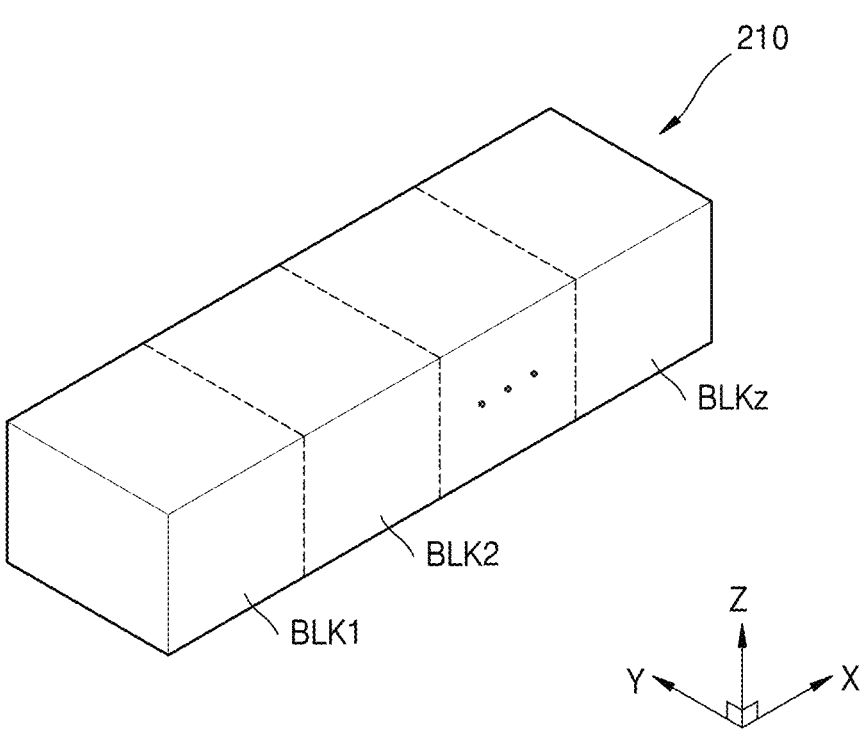
FIG. 3 is a diagram of the memory cell array illustrated in FIG. 1.

FIG. 3 is a diagram of the memory cell array 210 illustrated in FIG. 1. Referring to FIG. 3, the memory cell array 210 may include a plurality of memory blocks BLK1 through BLKz. Each of the memory blocks BLK1 through BLKz may have a three-dimensional structure (or a vertical structure). For example, each memory block BLK may include a structure extending in first through third directions. For example, each memory block BLK may include a plurality of memory cell strings extending in the first direction (a Z direction). Also, the plurality of memory cell strings may be two-dimensionally arranged in the second and third directions (X and Y directions). Each memory cell string may be connected to the bit line BL, the string selection line SSL, the word lines WLs, and the common source line CSL. Thus, each of the memory blocks BLK1 through BLKz may be connected to the plurality of bit lines BLs, the plurality of string selection lines SSLs, the plurality of word lines WLs, and the plurality of common source lines CSLs. The memory blocks BLK1 through BLKz will be described in further detail with reference to FIG. 4.

Figure 4:
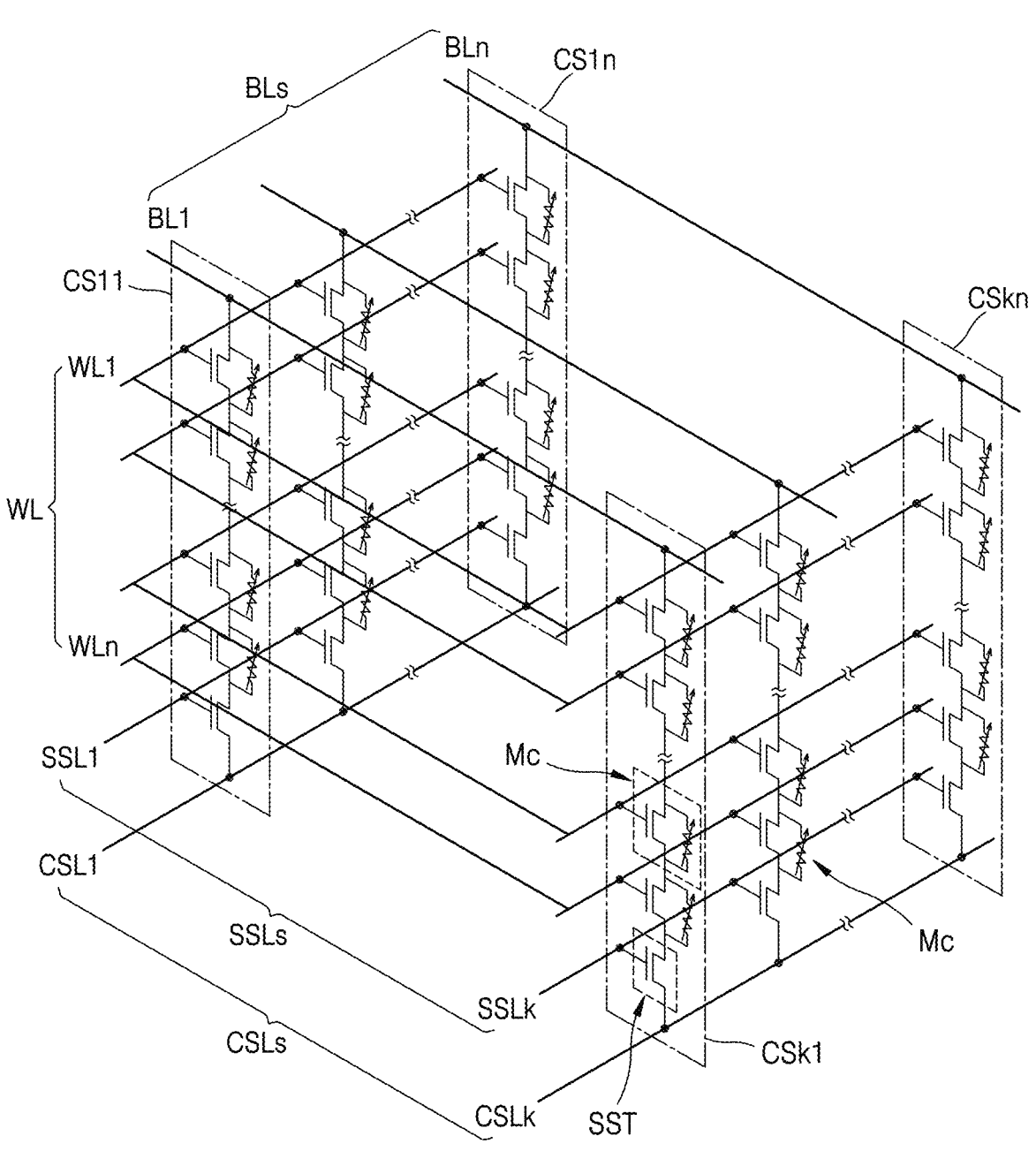
FIG. 4 is a circuit diagram of an equivalent circuit corresponding to a memory block, according to an embodiment.

FIG. 4 is a circuit diagram of an equivalent circuit corresponding to a memory block, according to an embodiment. For example, one of the memory blocks BLK1 through BLKz of the memory cell array 210 of FIG. 3 is illustrated in FIG. 4. Referring to FIGS. 3 and 4, each of the memory blocks BLK1 through BLKz may include a plurality of memory cell strings CS11 through CSkn. The plurality of memory cell strings CS11 through CSkn may be two-dimensionally arranged in a row direction and a column direction, thereby forming rows and columns. Each of the memory cell strings CS11 through CSkn may include a plurality of memory cells Mcs and a plurality of string selection transistors SSTs. The memory cells Mcs and the string selection transistors SSTs of each of the memory cell strings CS11 through CSkn may be stacked in a height direction.

Rows of the plurality of memory cell strings CS11 through CSkn may be connected to a plurality of string selection lines SSL1 through SSLk, respectively. For example, the string selection transistors SSTs of the memory cell strings CS11 through CS1$n$ may be commonly connected to the string selection line SSL1. The string selection transistors SSTs of the memory cell strings CSk1 through CSkn may be commonly connected to the string selection line SSLk.

Also, columns of the plurality of memory cell strings CS11 through CSkn may be connected to the plurality of bit lines BL1 through BLn, respectively. For example, the memory cells Mcs and the string selection transistors SSTs of the memory cell strings CS11 through CSk1 may be commonly connected to the bit line BL1, and the memory cells Mcs and the string selection transistors SSTs of the memory cell strings CS1$n$ through CSkn may be commonly connected to the bit line BLn.

Also, the rows of the plurality of memory cell strings CS11 through CSkn may be connected to the plurality of common source lines CSL1 through CSLk, respectively. For example, the string selection transistors SSTs of the plurality of memory cell strings CS11 through CS1$n$ may be commonly connected to the common source line CSL1, and the string selection transistors SST of the plurality of memory cell strings CSk1 through CSkn may be commonly connected to the common source line CSLk.

The memory cells Mc located at the same height from a substrate (or the string selection transistors SSTs) may be commonly connected to one word line WL, and the memory cells Mc located at different heights from the substrate (or the string selection transistors SSTs) may be connected to the plurality of word lines WL1 through WLm, respectively.

The memory block illustrated in FIG. 4 is an example. The disclosure is not limited to the memory block illustrated in FIG. 4. For example, the number of rows of the plurality of memory cell strings CS11 through CSkn may be increased or decreased. When the number of rows of the plurality of memory cell strings CS11 through CSkn is changed, the number of string selection lines connected to the rows of the memory cell strings CS11 through CSkn and the number of memory cell strings CS11 through CSkn connected to one bit line may also be changed. When the number of rows of the memory cell strings CS11 through CSkn is changed, the number of common source lines connected to the rows of the memory cell strings CS11 through CSkn may also be changed. Also, the number of columns of the memory cell strings CS11 through CSkn may be increased or decreased. When the number of columns of the memory cell strings CS11 through CSkn is changed, the number of bit lines connected to the columns of the memory cell strings CS11 through CSkn and the number of memory cell strings CS11 through CSkn connected to one string selection line may also be changed.

A height of each of the memory cell strings CS11 through CSkn may be increased or decreased. For example, the number of memory cells MC stacked in each of the memory cell strings CS11 through CSkn may be increased or decreased. When the number of memory cells MC stacked in each of the memory cell strings CS11 through CSkn is changed, the number of word lines WL may also be changed. For example, the number of string selection transistors SSTs provided to each of the memory cell strings CS11 through CSkn may be increased. When the number of string selection transistors SSTs provided to each of the memory cell strings CS11 through CSkn is changed, the number of string selection lines or the number of common source lines may also be changed. When the number of string selection transistors SSTs is increased, the string selection transistors SSTs may be stacked in a shape that is the same as the shape in which the memory cells MC are stacked.

For example, writing and reading operations may be performed for each row of the memory cell strings CS11 through CSkn. The memory cell strings CS11 through CSkn may be selected for each row by the common source lines CSLs, and the memory cell strings CS11 through CSkn may be selected for each row by the string selection lines SSLs. Also, the writing and reading operations may be performed for each page, in a selected row of the memory cell strings CS11 through CSkn. For example, the page may be one row of the memory cells MC connected to one word line WL. In the selected row of the memory cell strings CS11 through CSkn, the memory cells MCs may be selected for each page by the word lines WL.

Figure 5:
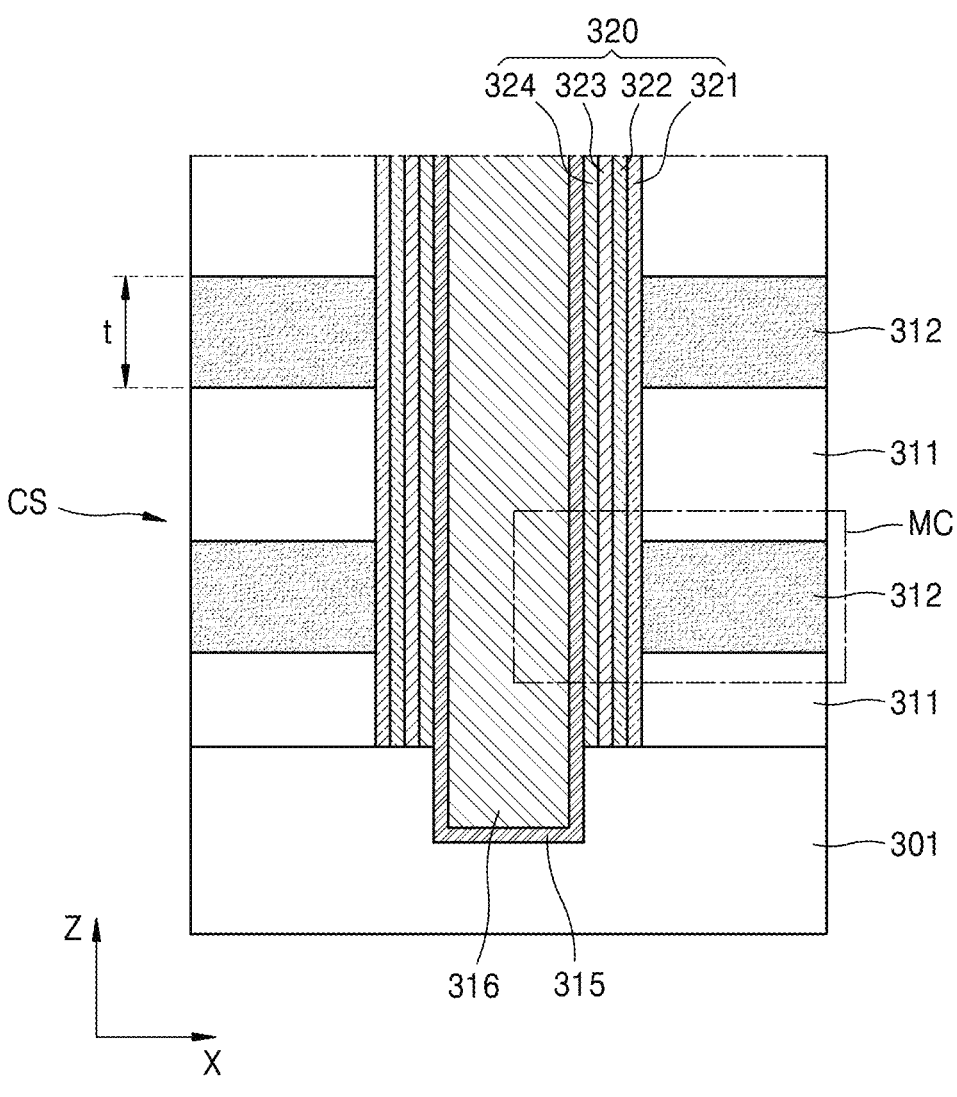
FIG. 5 is a schematic cross-sectional view of a structure of a respective memory cell string, according to an embodiment.

Each of the memory cells MCs in each of the memory cell strings CS11 through CSkn may correspond to a circuit in which a transistor and a resistor are connected in parallel. For example, FIG. 5 is a schematic cross-sectional view of a structure of a respective memory cell string CS, according to an embodiment. Referring to FIG. 5, the memory cell string CS may include a substrate 301. The substrate 301 may include, for example, a doped silicon material. Also, although now illustrated in detail, the substrate 301 may include a plurality of string selection transistors SSTs, peripheral circuits, etc.

Above the substrate 301, a plurality of insulating spacers 311 extending in a horizontal direction, that is, a second direction (an X direction) parallel with a surface of the substrate 301, and a plurality of gate electrodes 312 extending in the second direction may be alternately arranged. In other words, the memory cell string CS may include the plurality of insulating spacers 311 and the plurality of gate electrodes 312 that are alternately stacked in a vertical direction that is orthogonal to the second direction, that is, a first direction (a Z direction). The insulating spacers 311 may include, for example, a silicon oxide, but are not limited thereto. Each of the gate electrodes 312 may be connected to a word line WL, or each of the gate electrodes 312 may be directly a word line WL.

Also, the memory cell string CS may include a channel hole penetrating the plurality of insulating spacers 311 and the plurality of gate electrodes 312 in the first direction. A plurality of layers to form a channel and a resistor may be arranged on an inner side of the channel hole. For example, the memory cell string CS may include an insulating support 316 arranged in a center of the channel hole and extending in the first direction, a channel layer 315 surrounding the insulating support 316 and extending in the first direction, and a gate insulating layer 320 surrounding the channel layer 315 and extending in the first direction. The gate insulating layer 320 may be arranged between the channel layer 315 and the plurality of gate electrodes 312. The insulating support 316, the channel layer 315, and the gate insulating layer 320 may be arranged in a concentric circular shape.

The gate insulating layer 320 may include a diffusion barrier layer 321, a charge blocking layer 322, a charge trap layer 323, and a tunneling dielectric layer 324 extending, for example, in the first direction. The diffusion barrier layer 321 may be arranged between the channel layer 315 and the plurality of gate electrodes 312. The charge blocking layer 322 may be arranged between the channel layer 315 and the diffusion barrier layer 321. The charge trap layer 323 may be arranged between the channel layer 315 and the charge blocking layer 322. The tunneling dielectric layer 324 may be arranged between the channel layer 315 and the charge trap layer 323. The tunneling dielectric layer 324 may have a cylindrical shape surrounding the channel layer 315, the charge trap layer 323 may have a cylindrical shape surrounding the tunneling dielectric layer 324, the charge blocking layer 322 may have a cylindrical shape surrounding the charge trap layer 323, and the diffusion barrier layer 321 may have a cylindrical shape surrounding the charge blocking layer 322. In other words, the insulating support 316, the channel layer 315, the tunneling dielectric layer 324, the charge trap layer 323, the charge blocking layer 322, and the diffusion barrier layer 321 may be arranged in a concentric circular shape.

To this end, the diffusion barrier layer 321 may be conformally deposited on the plurality of insulating spacers 311 and the plurality of gate electrodes 312 and may extend in the first direction. The charge blocking layer 322 may be conformally deposited on a surface of the diffusion barrier layer 321 and may extend in the vertical direction. The charge trap layer 323 may be conformally deposited on a surface of the charge blocking layer 322 and may extend in the vertical direction. The tunneling dielectric layer 324 may be conformally deposited on a surface of the charge trap layer 323 and may extend in the vertical direction. The channel layer 315 may be conformally deposited on a surface of the tunneling dielectric layer 324 and may extend in the vertical direction. The insulating support 316 may be arranged to fill a remaining space of the center of the channel hole and may extend in the vertical direction. Consequently, the diffusion barrier layer 321, the charge blocking layer 322, the charge trap layer 323, and the tunneling dielectric layer 324 may have a shape, in which the diffusion barrier layer 321, the charge blocking layer 322, the charge trap layer 323, and the tunneling dielectric layer 324 extend on a surface of the channel layer 315 in the first direction.

The tunneling dielectric layer 324 may be a layer in which charge tunneling occurs. When a desired and/or alternatively predetermined voltage is applied to each of the gate electrodes 312, a charge flowing through the channel layer 315 may move through the tunneling dielectric layer 324 and may be trapped in the charge trap layer 323, and thus, information may be stored. The charge blocking layer 322 may limit and/or prevent the charge leakage to the insulating spacers 311 and the gate electrodes 312 through the charge trap layer 323. Also, the diffusion barrier layer 321 may limit and/or prevent the diffusion of metal atoms in the gate electrodes 312 into other layers.

The diffusion barrier layer 321 may include, for example, TiN, but is not necessarily limited thereto. The charge blocking layer 322 may include, for example, at least one of SiO, AlO, MgO, AlN, and GaN, but is not necessarily limited thereto. FIG. 5 illustrates, for convenience, that the charge blocking layer 322 is a single layer. However, the charge blocking layer 322 may have a multi-layer structure including different materials from each other. Also, the charge trap layer 323 may include, for example, at least one of SiN, GaN, GaO, HfO, ScO, SrO, ZrO, YO, TaO, BaO, and ZnS, but is not necessarily limited thereto. Also, the tunneling dielectric layer 324 may include, for example, SiO or other metal oxide, but is not necessarily limited thereto.

Although not shown, a drain may be arranged above the memory cell string CS to cover at least the channel layer 315. The drain may include a doped silicon material. The substrate 301 and the drain may be doped to be electrically opposite to each other. For example, when the substrate 301 is doped a p-type, the drain may be doped an n-type. Also, a bit line may be connected above the drain.

As shown by a box indicated by dashed lines in FIG. 5, any one gate electrode 312, a portion of the gate insulating layer 320 (that is, a portion of the diffusion barrier layer 321, a portion of the charge blocking layer 322, a portion of the charge trap layer 323, and a portion of the tunneling dielectric layer 324) adjacent to the gate electrode 312 in a horizontal direction, that is, in the second direction and a portion of the channel layer 315 adjacent to the gate electrode 312 in the second direction may form one memory cell MC. The memory cell MC having this structure may be vertically stacked in a multiple number to form the respective memory cell string CS. FIG. 5 illustrates that the memory cell MC is configured based on a charge trap flash (CTF) memory using a phase change material. However, the memory cell MC is not necessarily limited thereto. Thus, the structure of the layers arranged on the inner side of the channel hole is only an example and is not limited to the structure illustrated in FIG. 5.

According to an embodiment, a thickness t of each gate electrode 312 may, for example, be in a range of about 0.3 nm to about 15 nm. To this end, the gate electrode 312 may include metal-doped graphene. Unlike a previously known metal material, the metal-doped graphene may have relatively low charge dispersion at a thickness of about several nm, and thus, may have a lower resistance than the previous metal at a thickness of several nm. Thus, by using the metal-doped graphene as a material of the gate electrode 312, a resistance increase due to a thickness decrease of the gate electrode 312 may be suppressed or alleviated.

Also, by doping graphene with a metal material, each gate electrode 312 may have a work function that is greater than a work function of the diffusion barrier layer 321. For example, when graphene is doped with Ru, the work function of the gate electrode 312 may be about 4.915 eV to about 5.095 eV. This is a value greater than a work function (about 4.3 eV to about 4.65 eV) of TiN used as a material of the diffusion barrier layer 321. Thus, during an erase operation, a tunneling current may be decreased, and thus, the efficiency of the erase operation may be improved. Also, a leakage current may be decreased, and a breakdown voltage may be increased. The metal-doped graphene may include, for example, at least one metal particle selected from Ru, Al, Ti, Pt, Ta, Rh, Ir, and Co. A ratio of the metal particle to carbon in the metal-doped graphene may be about 1 atomic percent (at) % to about 50 at %. A work function of the metal-doped graphene may be greater than about 4.7 eV or greater than about 4.9 eV. For example, the work function of the metal-doped graphene may be about 4.7 eV to about 5.5 eV or about 4.9 eV to about 5.1 eV.

The graphene in the metal-doped graphene may include intrinsic graphene or nanocrystalline graphene. The intrinsic graphene may be crystalline graphene and may include crystals having a size greater than about 100 nm. The nanocrystalline graphene may include crystals having a size smaller than the size of the intrinsic graphene. For example, the nanocrystalline graphene may include crystals having a size of about 0.5 nm to about 500 nm, about 0.5 nm to about 150 nm, and/or about 0.5 nm to about 100 nm. In the intrinsic graphene, a ratio of carbon having an $sp^2$ bonding structure to total carbon, the ratio being measured through an X-ray photoelectron spectroscopy (XPS) analysis, may be about 100%. The intrinsic graphene may include little hydrogen. A density of the intrinsic graphene may be, for example, about 2.1 g/cc. In the nanocrystalline graphene, a ratio of carbon having an $sp^2$ bonding structure to total carbon may be, for example, about 50% to about 99%. Also, the nanocrystalline graphene may include, for example, hydrogen of about 1 at % to about 20 at %. Also, a density of the nanocrystalline graphene may be, for example, about 1.6 g/cc to about 2.1 g/cc.

The graphene may be formed, for example, by chemical vapor deposition (CVD), plasma-enhanced CVD (PECVD), etc. After forming the graphene by using CVD or PECVD, a metal may be deposited on the graphene, for example, by using atomic layer deposition (ALD) or CVD. Thereafter, when a heat treatment process is performed, carbon atoms in the graphene may move between metal particles due to the high solid solubility of the metal with respect to carbon, and thus, metal-doped graphene, in which metal particles are distributed in the graphene, may be formed. According to necessity, the metal-doped graphene may be formed by repeating the process of forming the graphene by using CVD or PECVD and the process of depositing the metal by using ALD or CVD several times.

According to the embodiment described above, a thickness of one memory cell MC may be reduced by reducing a thickness of the gate electrodes 312 or the word lines stacked in the cell string CS in the vertical direction, that is, the first direction. Thus, a total thickness of the memory cell string CS may be reduced, and the number of memory cells MC stacked in the memory cell string CS may be increased. Also, by forming the gate electrodes 312 by using the metal-doped graphene, the problem of an increase in specific resistance due to a thickness reduction of the gate electrodes 312 may be improved. Also, because the metal-doped graphene has a high work function, the performance of the vertical nonvolatile memory device may be improved.

Figure 6:
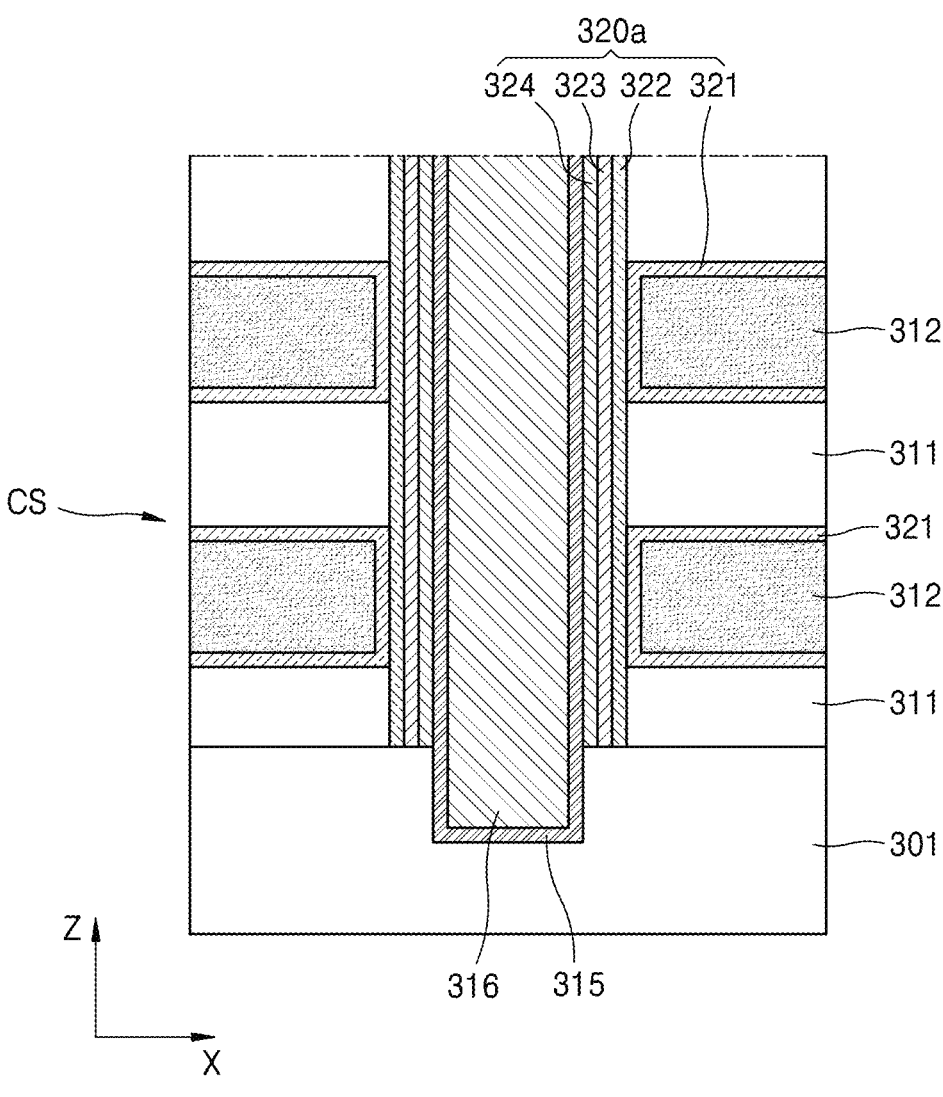
FIG. 6 is a schematic cross-sectional view of a structure of a respective memory cell string, according to another embodiment.

FIG. 6 is a schematic cross-sectional view of a structure of a respective memory cell string CS, according to another embodiment. In the embodiment illustrated in FIG. 5, all of the gate insulating layer 320, that is, the diffusion barrier layer 321, the charge blocking layer 322, the charge trap layer 323, and the tunneling dielectric layer 324 may extend in the first direction, and the plurality of gate electrodes 312 may directly contact the insulating spacers 311 respectively adjacent thereto. However, a gate insulating layer 320*a* illustrated in FIG. 6 may include a plurality of diffusion barrier layers 321 surrounding upper surfaces and lower surfaces of the plurality of gate electrodes 312, respectively. In this case, the diffusion barrier layer 321 may further be arranged between the gate electrode 312 and the insulating spacer 311. Also, a side surface of each of the plurality of insulating spacers 311 may directly contact the charge blocking layer 322. Each diffusion barrier layer 321 may include a portion extending in the first direction along a surface of the channel layer 315 and a portion extending in the second direction to cover the upper surface and the lower surface of each of the plurality of gate electrodes 312. Because the diffusion barrier layer 321 is arranged between the gate electrode 312 and the insulating spacer 311, the diffusion of metal atoms in the gate electrode 312 into the insulating spacer 311 may be limited and/or prevented. Structures of the charge blocking layer 322, the charge trap layer 323, the tunneling dielectric layer 324, and the gate electrode 312 may be the same as described with respect to the embodiment illustrated in FIG. 5.

Figure 7:
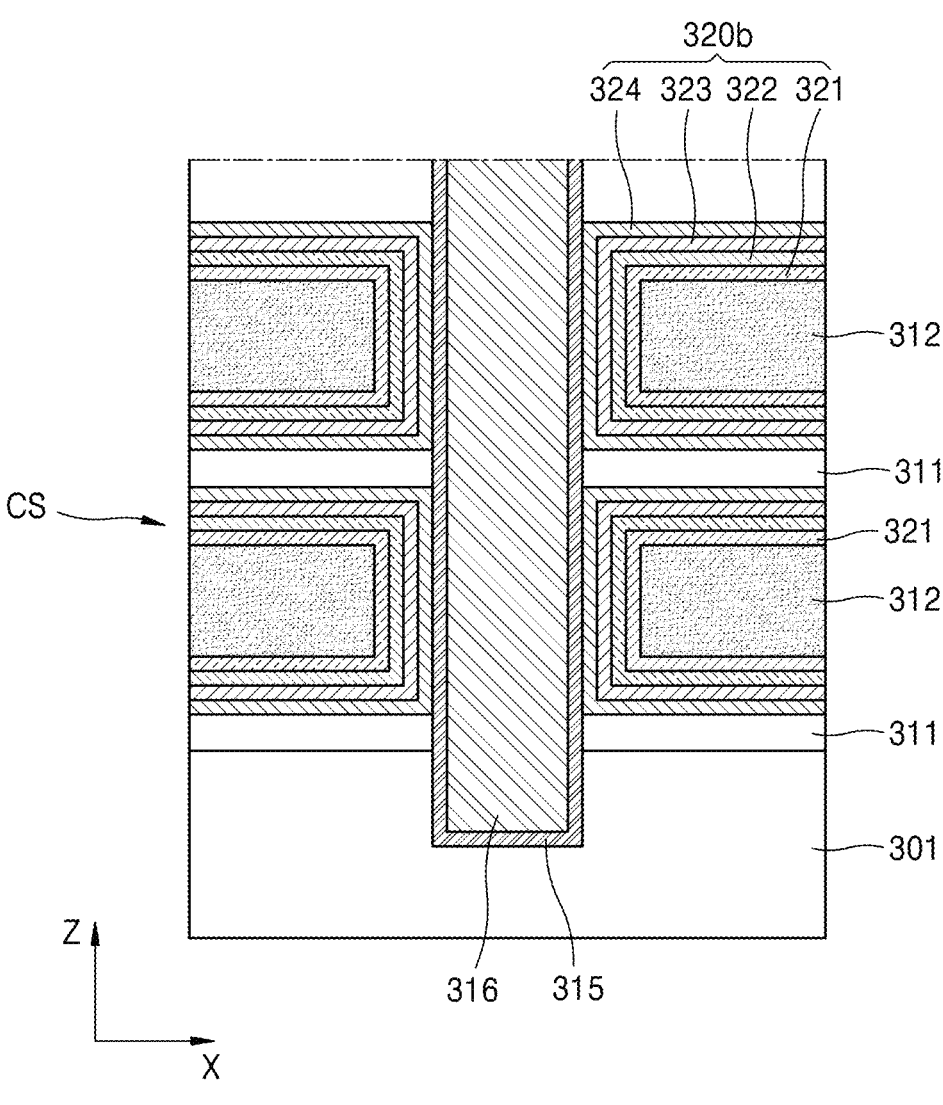
FIG. 7 is a schematic cross-sectional view of a structure of a respective memory cell string, according to another embodiment.

FIG. 7 is a schematic cross-sectional view of a structure of a respective memory cell string CS, according to another embodiment. Referring to FIG. 7, a gate insulating layer 320*b* may include a plurality of diffusion barrier layers 321, a plurality of charge blocking layers 322, a plurality of charge trap layers 323, and a plurality of tunneling dielectric layers 324, all of which are arranged to surround upper surfaces and lower surfaces of the plurality of gate electrodes 312, respectively. Each of the plurality of diffusion barrier layers 321, each of the plurality of charge blocking layers 322, each of the plurality of charge trap layers 323, and each of the plurality of tunneling dielectric layers 324 may include a portion extending in the first direction along a surface of the channel layer 315 and a portion extending in the second direction to cover the upper surface and the lower surface of each of the plurality of gate electrodes 312. In this case, the diffusion barrier layer 321, the charge blocking layer 322, the charge trap layer 323, and the tunneling dielectric layer 324 may be sequentially arranged in this stated order below and above each gate electrode 312, and the insulating spacer 311 may be arranged between two tunneling dielectric layers 324 facing each other. Also, the side surface of each of the plurality of insulating spacers 311 may directly contact the surface of the channel layer 315. According to an embodiment, because the charge trap layers 323 and the tunneling dielectric layers 324 may extend to surround the upper surfaces and the lower surfaces of the gate electrodes 312, respectively, areas in which tunneling occurs and areas in which charge traps occur may be increased.

It is described above that the diffusion barrier layer 321 and the charge blocking layer 322 are two separate layers. However, the diffusion barrier layer 321 and the charge blocking layer 322 may be formed as one layer including hexagonal boron nitride (h-BN). For example, FIG. 8 is a schematic cross-sectional view of a structure of a respective memory cell string CS, according to another embodiment.

Figure 8:
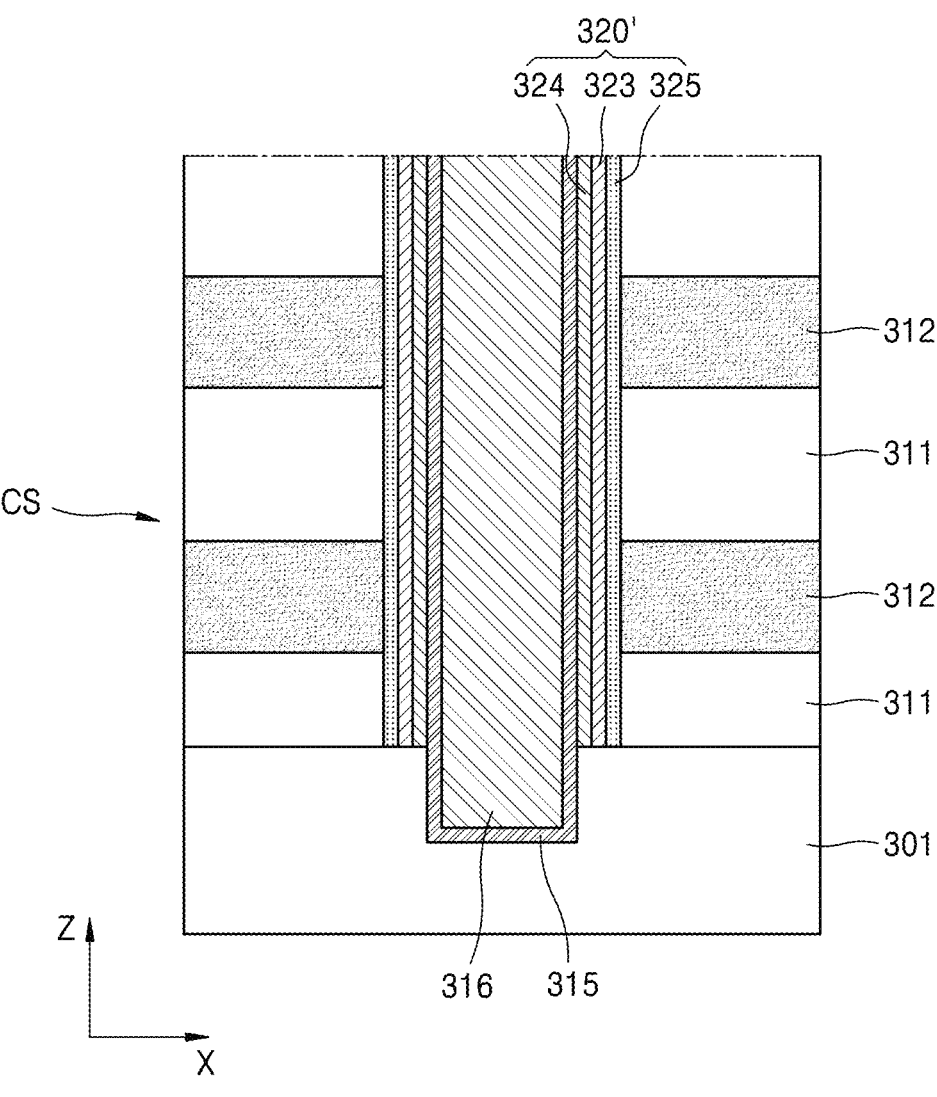
FIG. 8 is a schematic cross-sectional view of a structure of a respective memory cell string, according to another embodiment.

Referring to FIG. 8, a gate insulating layer 320' may include an h-BN layer 325 arranged between the channel layer 315 and the plurality of gate electrodes 312, the charge trap layer 323 arranged between the channel layer 315 and the h-BN layer 325, and the tunneling dielectric layer 324 arranged between the channel layer 315 and the charge trap layer 323. All of the h-BN layer 325, the charge trap layer 323, and the tunneling dielectric layer 324 may be arranged to extend in the first direction along a surface of the channel layer 315.

Because h-BN has a high bandgap of about 6 eV, the h-BN layer 325 may serve as an excellent charge blocking layer. Also, because h-BN may limit and/or prevent movement of a metal atom, the h-BN layer 325 may serve as an effective diffusion barrier. Thus, by using h-BN, the diffusion barrier layer 321 and the charge blocking layer 322 may be incorporated into one single layer.

The gate electrode 312 may include the metal-doped graphene described with reference to FIG. 5 or may include a general conductive metal material. For example, the gate electrode 312 may include W or Ru. When the gate electrode 312 includes a general conductive metal material, the h-BN layer 325 may further serve as a liner for increasing adhesion with the gate electrode 312 and improving the crystalline quality of the gate electrode 312. For example, the h-BN layer 325 may increase a size of a metal crystal of the gate electrode 312 and thus may decrease the resistance of the gate electrode 312.

Figure 9:
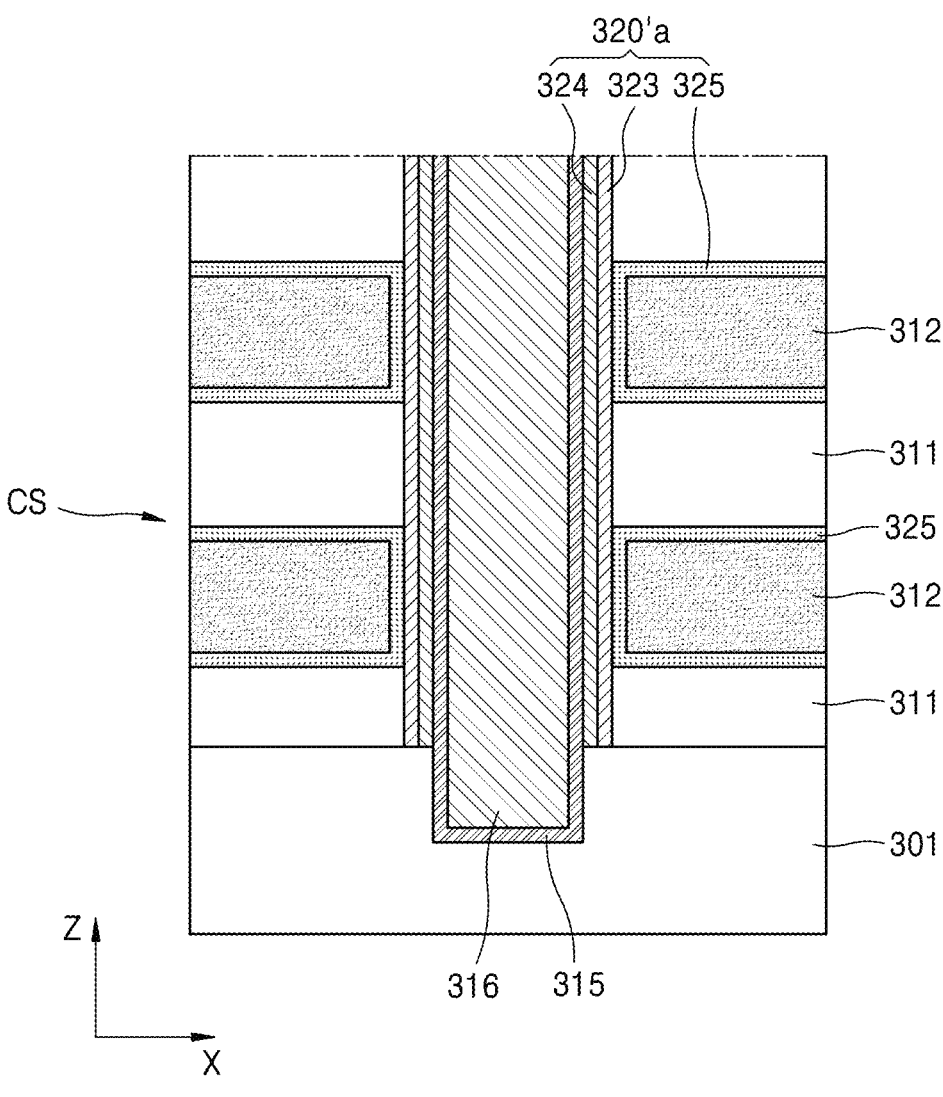
FIG. 9 is a schematic cross-sectional view of a structure of a respective memory cell string, according to another embodiment.

FIG. 9 is a schematic cross-sectional view of a structure of a respective memory cell string CS, according to another embodiment. Referring to FIG. 9, a gate insulating layer 320'a may include a plurality of h-BN layers 325 surrounding upper surfaces and lower surfaces of the plurality of gate electrodes 312, respectively. In this case, the h-BN layer 325 may further be arranged between the gate electrode 312 and the insulating spacer 311. Each h-BN layer 325 may include a portion extending in the first direction along a surface of the channel layer 315 and a portion extending in the second direction to cover the upper surface and the lower surface of each of the plurality of gate electrodes 312.

According to an embodiment, because an area of the gate electrode 312 contacting the h-BN layer 325 is increased, the quality of a metal crystal of the gate electrode 312 may further be improved. Also, because the h-BN layer 325 is two-dimensional crystals having a little thickness of about 0.3 nm to about 20 nm, a total thickness of the memory cell string CS may be reduced, compared to the embodiment illustrated in FIG. 6, and the number of memory cells stacked in the memory cell string CS may further be increased.

Figure 10:
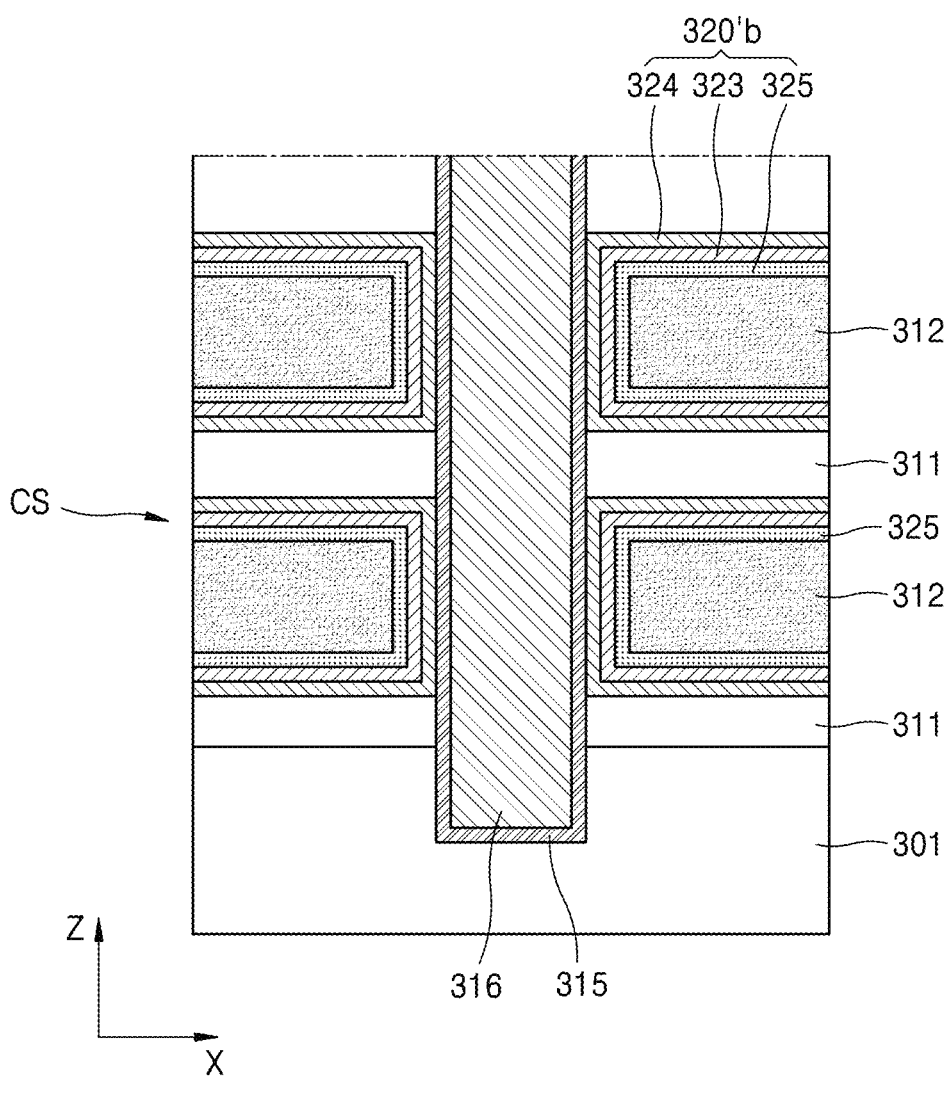
FIG. 10 is a schematic cross-sectional view of a structure of a respective memory cell string, according to another embodiment.

FIG. 10 is a schematic cross-sectional view of a structure of a respective memory cell string CS, according to another embodiment. Referring to FIG. 10, a gate insulating layer 320'b may include a plurality of h-BN layers 325, a plurality of charge trap layers 323, and a plurality of tunneling dielectric layers 324, all of which are arranged to surround upper surfaces and lower surfaces of the plurality of gate electrodes 312, respectively. Each of the plurality of h-BN layers 325, each of the plurality of charge trap layers 323, and each of the plurality of tunneling dielectric layers 324 may include a portion extending in the first direction along a surface of the channel layer 315 and a portion extending in the second direction to cover the upper surface and the lower surface of each of the plurality of gate electrodes 312. In this case, the h-BN layer 325, the charge trap layer 323, and the tunneling dielectric layer 324 may be sequentially arranged in this stated order below and above each gate electrode 312. According to an embodiment, because the diffusion barrier layer and the charge blocking layer are integrated as one h-BN layer 325, and the h-BN layer 325 is two-dimensional crystals having a little thickness, a total thickness of the memory cell string CS may be reduced, compared to the embodiment illustrated in FIG. 7, and the number of memory cells stacked in the memory cell string CS may further be increased.

Figure 11:
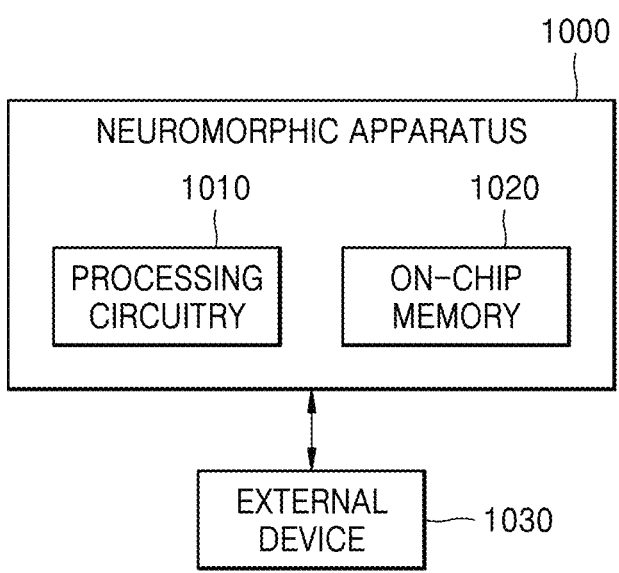
FIG. 11 is a schematic block diagram of a neuromorphic apparatus including a memory device, according to an embodiment.

A memory block according to the embodiment described above may be realized in the form of a chip and may be used as a neuromorphic computing platform. For example, FIG. 11 is a schematic view of a neuromorphic apparatus 1000 including a memory device, according to an embodiment. Referring to FIG. 11, the neuromorphic apparatus 1000 may include processing circuitry 1010 and/or a memory 1020. The memory 1020 of the neuromorphic apparatus 1000 may include the memory system 10 according to an embodiment.

The processing circuitry 1010 may be configured to control functions for driving the neuromorphic apparatus 1000. For example, the processing circuitry 1010 may be configured to control the neuromorphic apparatus 1000 by executing programs stored in the memory 1020 of the neuromorphic apparatus 1000. The processing circuitry 1010 may include hardware such as logic circuits; a hardware/software combination, such as a processor executing software; or a combination thereof. For example, a processor may include, but is not limited to, a central processing unit (CPU), a graphics processing unit (GPU), an application processor (AP) included in the neuromorphic apparatus 1000, an arithmetic logic unit (ALU), a digital signal processor, a microcomputer, a field programmable gate array (FPGA), a system-on-chip (SoC), a programmable logic unit, a microprocessor, an application-specific integrated circuit (ASIC), or the like. Also, the processing circuitry 1010 may be configured to read/write a variety of data from/in an external device 1030 and/or execute the neuromorphic apparatus 1000 by using the read/written data. The external device 1030 may include an external memory and/or sensor array with an image sensor (e.g., a CMOS image sensor circuit).

The neuromorphic apparatus 1000 in FIG. 11 may be applied to a machine learning system. The machine learning system may utilize a variety of artificial neural network organizational and processing models, such as convolutional neural networks (CNN), de-convolutional neural networks, recurrent neural networks (RNN) optionally including long short-term memory (LSTM) units and/or gated recurrent units (GRU), stacked neural networks (SNN), state-space dynamic neural networks (SSDNN), deep belief networks (DBN), generative adversarial networks (GANs), and/or restricted Boltzmann machines (RBM).

Such machine learning systems may include other forms of machine learning models, such as, for example, linear and/or logistic regression, statistical clustering, Bayesian classification, decision trees, dimensionality reduction such as principal component analysis, and expert systems; and/or combinations thereof, including ensembles such as random forests. Such machine learning models may be used to provide various services, for example, an image classify service, a user authentication service based on bio-information or biometric data, an advanced driver assistance system (ADAS) service, a voice assistant service, an automatic speech recognition (ASR) service, or the like, and may be mounted and executed by other electronic devices.

Figure 12:
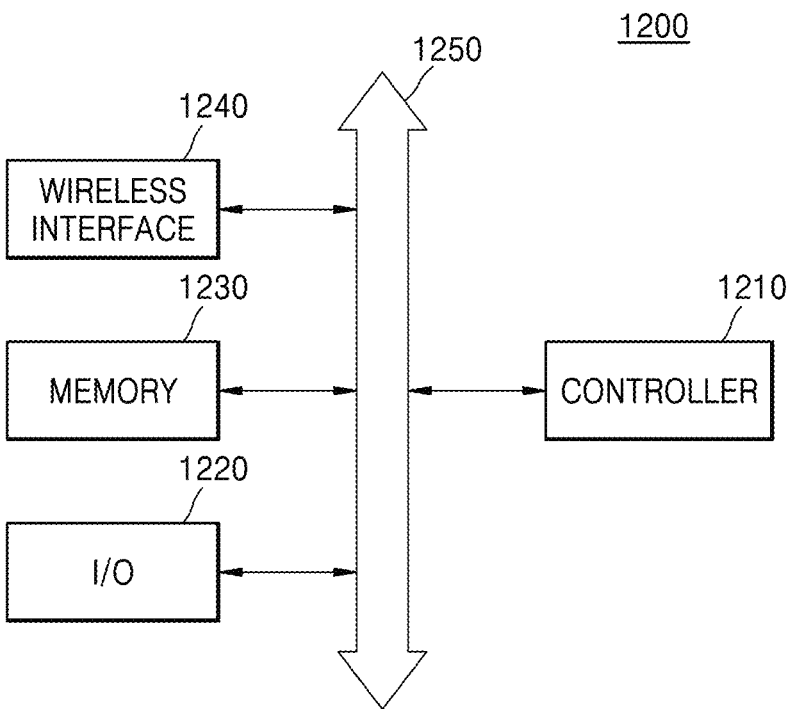
FIG. 12 is a block diagram of an electronic device according to an embodiment.

Nonvolatile memory devices according to some example embodiments may be applied to an electronic device. For example, FIG. 12 is a block diagram of an electronic device 1200 according to an embodiment.

The electronic device 1200 may form a wireless communication device or a device capable of transmitting and/or receiving information in a wireless environment. The electronic device 1200 may include a controller 1210, an input/output device (I/O) 1220, a memory 1230, and a wireless interface 1240, which may be connected to each other through a bus 1250.

The controller 1210 may include at least one selected from the group consisting of a microprocessor, a digital signal processor, and a processing device similar thereto. User commands may be input through the I/O device 1220 for the controller 1210, and the I/O device 1220 may include at least one selected from the group consisting of a keypad, a keyboard, and a display. The memory 1230 may be used to store instructions executed by controller 1210 and/or store data. For example, the memory 1230 may be used to store user data. The electronic device 1200 may use the wireless interface 1240 to transmit/receive data through a wireless communication network. The wireless interface 1240 may include an antenna and/or a wireless transceiver. In some embodiments, the electronic device 1200 may be used for communication interface protocols (e.g., a third generation communication system such as code division multiple access (CDMA), global system for mobile communications (GSM), north American digital cellular (NADC), extended-time division multiple access (E-TDMA), and/or wide band code division multiple access (WCDMA), a fourth generation communication system such as 4G LTE, a fifth generation communication system and the like). The memory 1230 of the electronic device 1200 may include memory system 10 with the memory device 200 described above in FIGS. 1-2. The memory 1230 may include the memory cell array 210 and memory block(s) in FIGS. 3 and 4, which may include memory cell strings according to any one of FIGS. 5 to 10 described above.

One or more of the elements disclosed above may include or be implemented in processing circuitry such as hardware including logic circuits; a hardware/software combination such as a processor executing software; or a combination thereof. For example, the processing circuitry may include, but is not limited to, a central processing unit (CPU), an arithmetic logic unit (ALU), a digital signal processor, a microcomputer, a field programmable gate array (FPGA), a System-on-Chip (SoC), a programmable logic unit, a micro-processor, application-specific integrated circuit (ASIC), etc.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of inventive concepts as defined by the following claims.

What is claimed is:

1. A nonvolatile memory device comprising:
   a channel layer extending in a first direction;
   a plurality of gate electrodes and a plurality of spacers each extending in a second direction crossing the first direction, the plurality of gate electrodes and the plurality of spacers being alternately arranged with each other in the first direction; and
   a gate insulating layer extending in the first direction between the channel layer and the plurality of gate electrodes,
   wherein each of the plurality of gate electrodes includes a metal-doped graphene,
   the metal-doped graphene includes a metal particle, and
   the metal particle includes at least one of Ru, Ti, Pt, Ta, Rh, Ir, and Co.

2. The nonvolatile memory device of claim 1, wherein a ratio of the metal particle to carbon in the metal-doped graphene is about 1 atomic percent (at) % to about 50 at %.

3. The nonvolatile memory device of claim 1, wherein a ratio of carbon having an $sp^2$ bonding structure to total carbon in the metal-doped graphene is about 50% to about 99%.

4. The nonvolatile memory device of claim 1, wherein the metal-doped graphene includes intrinsic graphene or nanocrystalline graphene.

5. The nonvolatile memory device of claim 1, wherein the metal-doped graphene includes nanocrystalline graphene, and
   the nanocrystalline graphene includes crystals having a size of about 0.5 nm to about 500 nm.

6. The nonvolatile memory device of claim 1, wherein a work function of the metal-doped graphene is greater than about 4.7 eV.

7. The nonvolatile memory device of claim 6, wherein the work function of the metal-doped graphene is greater than about 4.9 eV.

8. The nonvolatile memory device of claim 1, wherein the gate insulating layer includes:
   a diffusion barrier layer between the channel layer and the plurality of gate electrodes;
   a charge blocking layer between the channel layer and the diffusion barrier layer;
   a charge trap layer between the channel layer and the charge blocking layer; and
   a tunneling dielectric layer between the channel layer and the charge trap layer.

9. The nonvolatile memory device of claim 8, wherein the diffusion barrier layer, the charge blocking layer, the charge trap layer, and the tunneling dielectric layer extend in the first direction along a surface of the channel layer.

10. The nonvolatile memory device of claim 8, wherein the charge blocking layer, the charge trap layer, and the tunneling dielectric layer extend in the first direction along a surface of the channel layer, the diffusion barrier layer includes a first portion and a second portion, the first portion extends in the first direction along the surface of the channel layer, the second portion extends in the second direction, and the second portion covers an upper surface of each of the plurality of gate electrodes and a lower surface of each of the plurality of gate electrodes.

11. The nonvolatile memory device of claim 8, wherein the diffusion barrier layer and the charge blocking layer are integrated in a single layer including hexagonal boron nitride (h-BN).

12. The nonvolatile memory device of claim 8, wherein the gate insulating layer includes a hexagonal boron nitride (h-BN) layer between the channel layer and the plurality of gate electrodes, a charge trap layer between the channel layer and the h-BN layer, and a tunneling dielectric layer between the channel layer and the charge trap layer.

13. The nonvolatile memory device of claim 12, wherein the h-BN layer, the charge trap layer, and the tunneling dielectric layer extend in the first direction along a surface of the channel layer.

14. The nonvolatile memory device of claim 12, wherein the charge trap layer and the tunneling dielectric layer extend in the first direction along a surface of the channel layer, and the h-BN layer includes a portion extending in the first direction along the surface of the channel layer and a portion extending in the second direction to cover an upper surface and a lower surface of each of the plurality of gate electrodes.

15. The nonvolatile memory device of claim 12, wherein the h-BN layer, the charge trap layer, and the tunneling dielectric layer each include a portion extending in the first direction along a surface of the channel layer and a portion extending in the second direction to cover an upper surface and a lower surface of each of the plurality of gate electrodes.

16. The nonvolatile memory device of claim 15, wherein a side surface of each of the plurality of spacers directly contacts the surface of the channel layer.

17. A neuromorphic apparatus comprising:

a processing circuit; and a memory system, wherein the memory system includes the nonvolatile memory device of claim 1 and a memory controller configured to perform a control operation on the nonvolatile memory device.

18. A nonvolatile memory device comprising:

a channel layer extending in a first direction;

a plurality of gate electrodes each extending in a second direction crossing the first direction, the plurality of gate electrodes spaced apart from each other in the first direction along a sidewall of the channel layer; and a gate insulating layer between the channel layer and the plurality of gate electrodes, wherein each of the plurality of gate electrodes includes a metal-doped graphene, the metal-doped graphene includes a metal particle, and the metal particle includes at least one of Ru, Ti, Pt, Ta, Rh, Ir, and Co.

19. The nonvolatile memory device of claim 18, wherein the gate insulating layer includes a charge trap layer spaced apart from the channel layer and the plurality of gate electrodes.

20. The nonvolatile memory device of claim 19, wherein the gate insulating layer includes a tunneling dielectric layer between the channel layer and the charge trap layer.

21. The nonvolatile memory device of claim 19, wherein the gate insulating layer includes a hexagonal boron nitride (h-BN) layer between the charge trap layer and the plurality of gate electrodes.

22. The nonvolatile memory device of claim 19, wherein the gate insulating layer includes a diffusion barrier layer between the charge trap layer and the plurality of gate electrodes, and the gate insulating layer includes a charge blocking layer between the charge trap layer and the diffusion barrier layer.

* * * * *